United States Patent
Yeh et al.

(10) Patent No.: US 7,623,001 B2
(45) Date of Patent: Nov. 24, 2009

(54) ELECTROMAGNETIC INTERFERENCE ELIMINATING APPARATUS

(75) Inventors: Wei-Hao Yeh, Taichung (TW); Wen-Hung Wang, Dali (TW)

(73) Assignee: Universal Scientific Industrial Co., Ltd., Nan-Tou (TW)

( * ) Notice: Subject to any disclaimer, the term of this patent is extended or adjusted under 35 U.S.C. 154(b) by 0 days.

(21) Appl. No.: 12/007,823

(22) Filed: Jan. 16, 2008

(65) Prior Publication Data

US 2009/0179710 A1    Jul. 16, 2009

(51) Int. Cl.
*H04B 3/30* (2006.01)
*H03H 7/01* (2006.01)

(52) U.S. Cl. .......................... 333/12; 333/175; 333/177; 333/181

(58) Field of Classification Search .................. 333/12, 333/175, 177, 181, 185
See application file for complete search history.

(56) References Cited

U.S. PATENT DOCUMENTS

| | | | | |
|---|---|---|---|---|
| 5,072,200 A * | 12/1991 | Ranky | .......................... | 333/167 |
| 7,123,083 B2 * | 10/2006 | Greitschus et al. | .......... | 327/553 |
| 7,459,995 B2 * | 12/2008 | Suzuki | ........................ | 333/172 |

\* cited by examiner

*Primary Examiner*—Robert Pascal
*Assistant Examiner*—Kimberly E Glenn
(74) *Attorney, Agent, or Firm*—Kile Goekjian Reed & McManus PLLC

(57) ABSTRACT

An electromagnetic interference eliminating apparatus includes a multi-stage filter that is composed of inductors, capacitors and resistors, and an active filter. The multi-stage filter receives an input signal and provides an eliminating band to eliminate the noise in the input signal. The active filter is connected with the multi-stage filter for buffering the input signal that has been eliminated and exactly outputting an output signal.

9 Claims, 4 Drawing Sheets

ELECTROMAGNETIC INTERFERENCE ELIMINATING APPARATUS

BACKGROUND OF THE INVENTION

1. Field of the Invention

The present invention relates to an electromagnetic interference eliminating apparatus. In particular, this invention relates to an electromagnetic interference eliminating apparatus that eliminates the common mode voltage noise and the differential mode voltage noise generated from the electromagnetic interference (EMI).

2. Description of the Related Art

In a circuit, the sudden current or voltage change in the rectifier diode, the filtering capacitor and the bead will generate EMI. High order harmonic noise also exists in the circuit. If the EMI is not eliminated, the loading equipments or the circuit may be damaged. Therefore, in some countries there are safety rules concerning EMI.

As the operating frequency of the circuit becomes higher, the EMI problem also becomes more serious. Therefore, an EMI filter is fitted to the circuit. The EMI filter eliminates the common mode voltage noise and the differential mode voltage noise to meet the safety standards.

The traditional EMI eliminating method is to increase the capacitance, increase the quantity of the capacitors, or connect beads in serial so as to eliminate the common mode voltage noise or the differential mode voltage noise generated from the EMI.

However, the filter for eliminating the common mode voltage noise or the differential mode voltage noise generated from the EMI usually uses the inductor as the dominate components. The application frequency range is very narrow so that its effect is poor. Furthermore, it still cannot eliminate the high frequency harmonics. When it processes the EMI, the important signal may be attenuated and deformed.

SUMMARY OF THE INVENTION

One particular aspect of the present invention is to provide an electromagnetic interference eliminating apparatus. The electromagnetic interference eliminating apparatus includes a multi-stage filter composed of inductors, capacitors and resistors, and an active filter. The electromagnetic interference eliminating apparatus can eliminate the common mode voltage noise and the differential mode voltage noise generated from EMI, attenuate a signal with a huge power, and maintain the important signal.

The electromagnetic interference eliminating apparatus has an input terminal and an output terminal, and includes a multi-stage filter and an active filter. The multi-stage filter is connected with the input terminal for receiving an input signal and providing an eliminating band to eliminate the noise in the input signal. The active filter is connected with the multi-stage filter and the output terminal for buffering the input signal and exactly outputting an output signal.

The multi-stage filter includes a first resistor, a Y-shaped inductor circuit, and a Y-shaped capacitor circuit. The first terminal of the first resistor is connected with the input terminal. The first terminal of the Y-shaped inductor circuit is connected with the second terminal of the first resistor. The three terminals of the Y-shaped capacitor circuit are connected with the three terminals of the Y-shaped inductor circuit in parallel.

The active filter includes a second resistor, a low pass capacitor and a unit gain buffer. The first terminal of the second resistor is connected with the second terminal of the Y-shaped inductor circuit. The first terminal of the low pass capacitor is connected with the second terminal of the Y-shaped inductor circuit. The second terminal of the low pass capacitor is connected with a grounding terminal. The first input terminal of the unit gain buffer is connected with the second terminal of the second resistor. The second input terminal of the unit gain buffer is connected with the output terminal.

The electromagnetic interference eliminating apparatus can identify the harmonics that will be eliminated in different carrier frequency and use the eliminating band provided by the multi-stage filter to simultaneously eliminate the common mode voltage noise and the differential mode voltage noise generated from the EMI. Furthermore, by utilizing the buffering function of the active filter, the output signal is exactly outputted to maintain the important signal.

For further understanding of the invention, reference is made to the following detailed description illustrating the embodiments and examples of the invention. The description is only for illustrating the invention and is not intended to limit of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
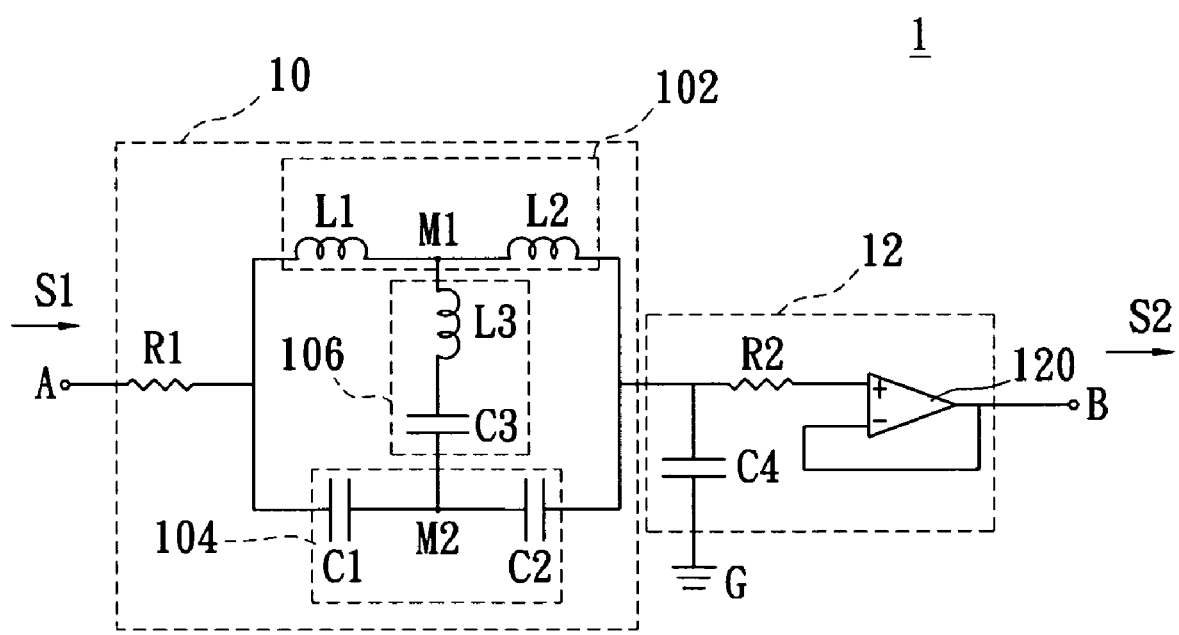
FIG. 1 is a circuit diagram of the first embodiment of the present invention.

Reference is made to FIG. 1, which shows a circuit diagram of the first embodiment of the present invention. The electromagnetic interference eliminating apparatus 1 has an input terminal A and an output terminal B, and includes a multi-stage filter 10 and an active filter 12.

The multi-stage filter 10 is connected with the input terminal A and receives an input signal S1 from the input terminal A. The multi-stage filter 10 provides an eliminating band to eliminate the noise in the input signal S1. The active filter 12 is connected with the multi-stage filter 10 and the output terminal B for buffering the eliminated input signal S1 and exactly outputting an output signal S2 to the output terminal B.

Reference is made to FIG. 1 again. The multi-stage filter 10 includes a first resistor R1, a series connection inductor combination circuit 102, a series connection capacitor combination circuit 104, and a series connection capacitor and inductor combination circuit 106. The first terminal of the first resistor R1 is connected with the input terminal A. The first terminal of the series connection inductor combination circuit 102 is connected with the second terminal of the first resistor R1. The series connection capacitor combination circuit 104 is connected with the two terminals of the series connection inductor combination circuit 102 in parallel. The series connection capacitor and inductor combination circuit 106 is connected between the series connection inductor combination circuit 102 and the series connection capacitor combination circuit 104.

Reference is made to FIG. 1 again. The series connection inductor combination circuit 102 is composed of a first inductor L1 and a second inductor L2 that are connected together in serial. The series connection capacitor combination circuit 104 is composed of a first capacitor C1 and a second capacitor C2 that are connected together in serial. The series connection capacitor and inductor combination circuit 106 is composed of a third capacitor C3 and a third inductor L3 that are connected together in serial. Two terminals of the series connection capacitor and inductor combination circuit 106 are respectively connected with the connection point M1 which is between the first inductor L1 and the second inductor L2 and the connection point M2 which is between the first capacitor C1 and the second capacitor C2. The first inductor L1, the second inductor L2 and the third inductor L3 form a Y-shaped inductor circuit. The first capacitor C1, the second capacitor C2 and the third capacitor C3 form a Y-shaped capacitor circuit. The Y-shaped inductor circuit is coupled with the Y-shaped capacitor circuit in parallel.

Reference is made to FIG. 1 again. The active filter 12 includes a second resistor R2, a low pass capacitor C4 and a unit gain buffer 120. The first terminal of the second resistor R2 is connected with the second terminal of the series connection inductor combination circuit 102. The first terminal of the low pass capacitor C4 is connected with the second terminal of the series connection inductor combination circuit 102. The second terminal of the low pass capacitor C4 is connected with a grounding terminal G. The first input terminal of the unit gain buffer 120 is connected with the second terminal of the second resistor R2. The second input terminal of the unit gain buffer 120 is connected with the output terminal B.

Figure 2:
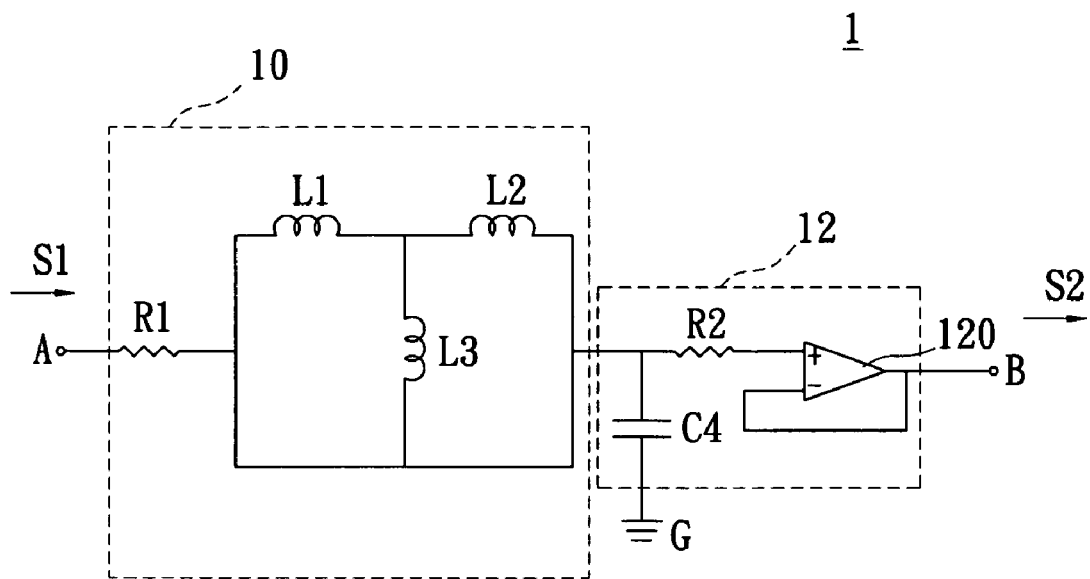
FIG. 2 is a circuit diagram of the first embodiment of the present invention operated in high frequency.

Reference is made to FIGS. 1 and 2. FIG. 2 shows a circuit diagram of the first embodiment of the present invention operated in high frequency. When the electromagnetic interference eliminating apparatus 1 of the present invention is operated in high frequency, the Y-shaped capacitor circuit (C1, C2, C3) and the low pass capacitor C4 are in a short-circuit status with a low impedance and the Y-shaped inductor circuit (L1, L2, L3) is in a high impedance status. The high impedance Y-shaped inductor circuit (L1, L2, L3) is used for blocking the high frequency current noise and guiding the high frequency current noise to the grounding terminal G via the short circuit low pass capacitor C4. Therefore, by utilizing the Y-shaped inductor circuit (L1, L2, L3), the Y-shaped capacitor circuit (C1, C2, C3) and the low pass capacitor C4, the noise current heavily occurred in a specific band is absorbed to eliminate the common mode voltage noise and the differential mode voltage noise generated from the EMI.

Therefore, the electromagnetic interference eliminating apparatus 1 of the present invention can identify the harmonics that will be eliminated in different carrier frequency and utilizes the elimination band provided from the multi-stage filter 10 to eliminate the common mode voltage noise and the differential mode voltage noise generated from the EMI. Simultaneously, by utilizing the buffering function of the active filter 12, the output signal is exactly outputted to maintain the quality of the important signal.

Figure 3:
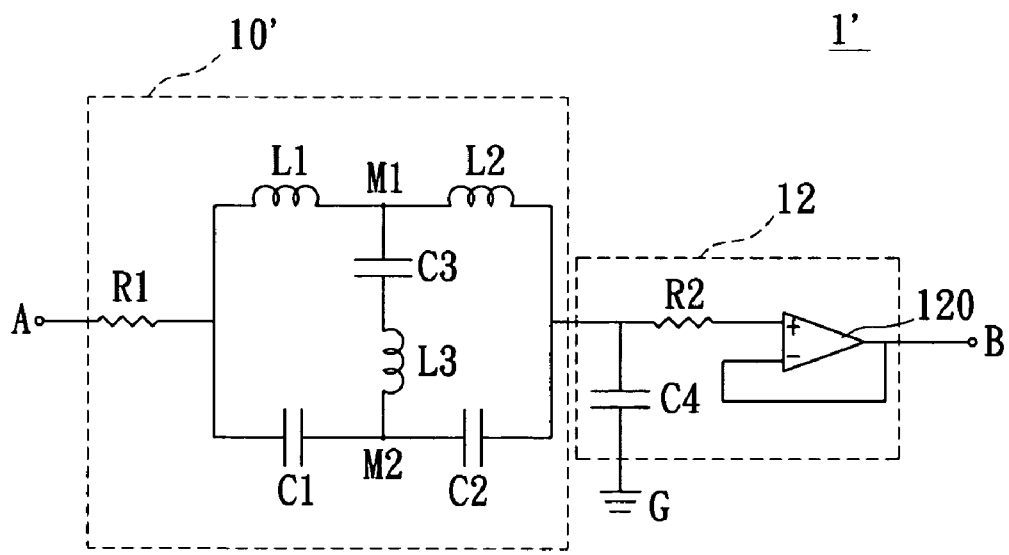
FIG. 3 is a circuit diagram of the second embodiment of the present invention.

Reference is made to FIGS. 1 and 3. FIG. 3 shows a circuit diagram of the second embodiment of the present invention operated in high frequency. The elements in the second embodiment that are the same as ones in the first embodiment are labeled by the same symbols. The operation principle and the effect of the second embodiment are the same as ones of the first embodiment. The difference is that the structure of the multi-stage filter is different from each other. For the multi-stage filter 10 in the first embodiment, the first terminal of the third inductor L3 is connected with the connection point M1 which is between the first inductor L1 and the second inductor L2, the first terminal of the third capacitor C3 is connected with the connection point M2 which is between the first capacitor C1 and the second capacitor C2, and the second terminal of the third capacitor C3 is connected with the second terminal of the third inductor L3.

However, for the multi-stage filter 10' in the second embodiment, the first terminal of the third inductor L3 is connected with the connection point M2 which is between the first capacitor C1 and the second capacitor C2, the first terminal of the third capacitor C3 is connected with the connection point M1 which is between the first inductor L1 and the second inductor L2, and the second terminal of the third capacitor C3 is connected with the second terminal of the third inductor L3.

Figure 4:
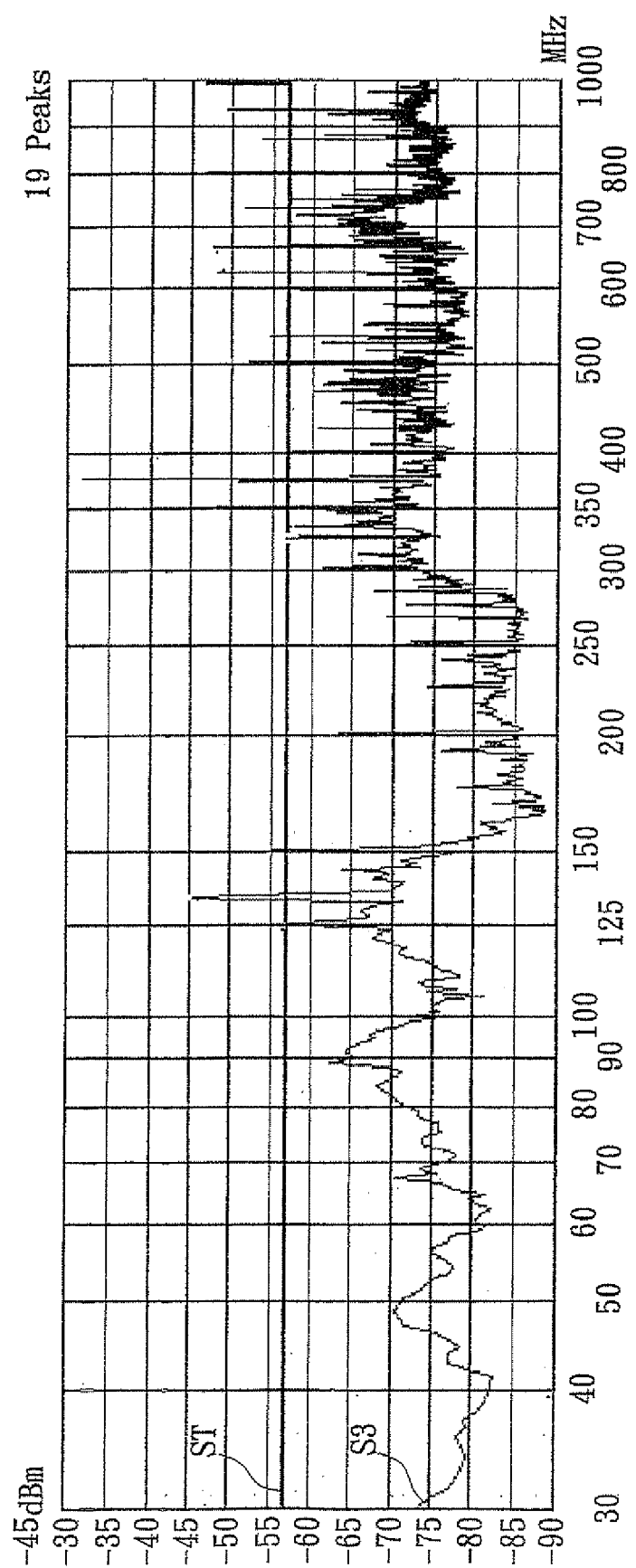
FIG. 4 is a waveform diagram of the EMI signal of the traditional art.
Figure 5:
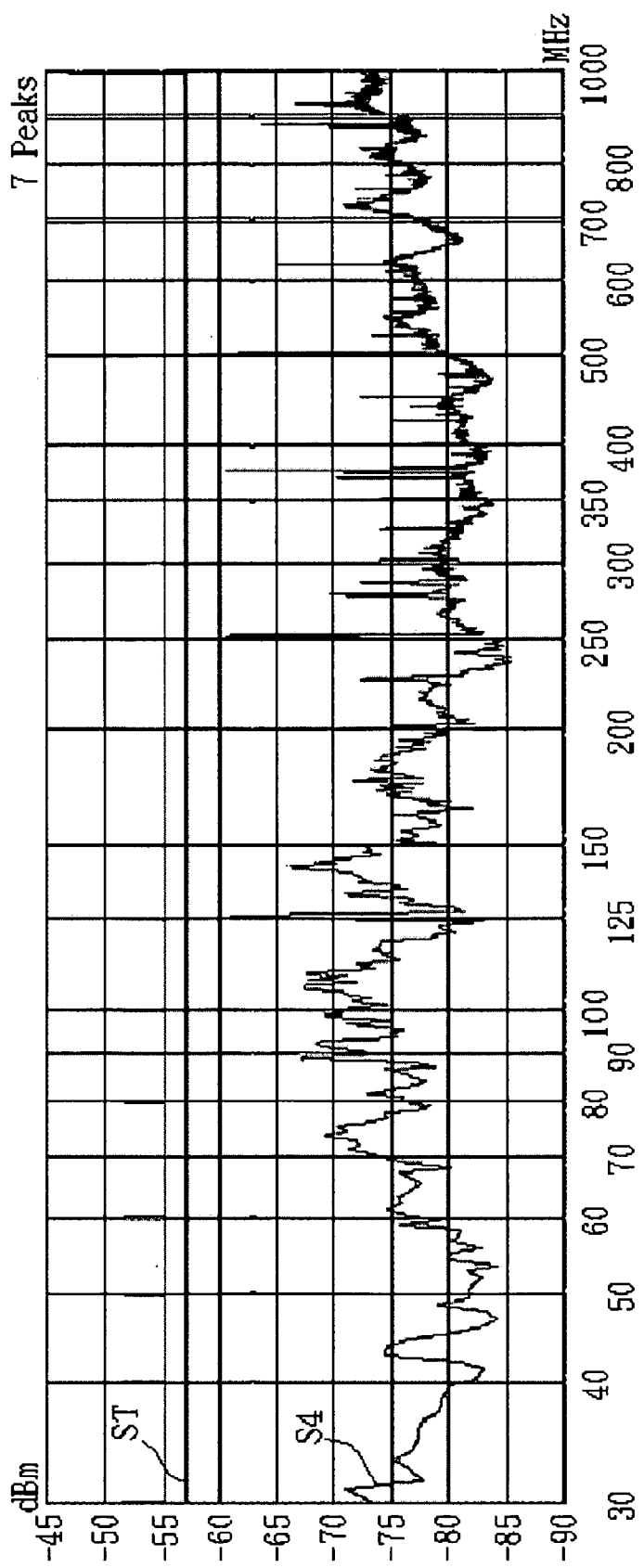
FIG. 5 is a waveform diagram of the EMI signal of the present invention.

Reference is made to FIG. 4, which shows a waveform diagram of the EMI signal of the traditional art. The EMI signal S3 of the traditional art cannot be retained within the safety standard ST. Reference is made to FIG. 5, which shows a waveform diagram of the EMI signal of the present invention. The EMI signal S4 of the present invention is retained within the safety standard ST. Therefore, the present invention easily attenuates and eliminates the common mode voltage and the differential mode voltage with 10~20 dBm. The EMI is reduced, and the signal distortion is avoided.

The electromagnetic interference eliminating apparatus can identify the harmonics that will be eliminated in different carrier frequency and use the eliminating band provided by the multi-stage filter to simultaneously eliminate the common mode voltage noise and the differential mode voltage noise generated from the EMI. Furthermore, by utilizing the buffering function of the active filter, the output signal is exactly outputted to maintain the important signal. Therefore, the problems of the traditional art, such as the high frequency harmonic cannot be fully eliminated and the signal is distorted, are solved.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An electromagnetic interference eliminating apparatus, having an input terminal and an output terminal, comprising:
    a multi-stage filter connected with the input terminal for receiving an input signal and providing an eliminating band to eliminate noise in the input signal, wherein the multi-stage filter comprises:
    a first resistor having two terminals, wherein a first of the two terminals of the first resistor is connected with the input terminal;
    a Y-shaped inductor circuit having three terminals, wherein a first of the three terminals of the Y-shaped inductor circuit is connected with a second of the two terminals of the first resistor;
    a Y-shaped capacitor circuit having three terminals, wherein the three terminals of the Y-shaped capacitor circuit are connected with the three terminals of the Y-shaped inductor circuit in parallel; and
    an active filter connected with the multi-stage filter and the output terminal for buffering the input signal and exactly outputting an output signal to the output terminal.

2. The electromagnetic interference eliminating apparatus as claimed in claim 1, wherein the active filter comprises:

a second resistor having two terminals, wherein a first of the two terminals of the second resistor is connected with a second of the three terminals of the Y-shaped inductor circuit;

a low pass capacitor having two terminals, wherein a first of the two terminals of the low pass capacitor is connected with the second of the three terminals of the Y-shaped inductor circuit and a second of the two terminals of the low pass capacitor is connected with a grounding terminal; and a unit gain buffer having two input terminals, wherein the first input terminal of the unit gain buffer is connected with a second of the two terminals of the second resistor and the second input terminal of the unit gain buffer is connected with the output terminal.

3. The electromagnetic interference eliminating apparatus as claimed in claim 1, wherein the Y-shaped inductor circuit comprises:

a first inductor having two terminals, wherein a first of the two terminals of the first inductor is connected with the second of the two terminals of the first resistor;

a second inductor having two terminals, wherein a first of the two terminals of the second inductor is connected with a second of the two terminals of the first inductor and a second of the two terminals of the second inductor is connected with a first of two terminals of a second resistor; and a third inductor having two terminals, wherein a first of the two terminals of the third inductor is connected with a connection point which is between the first inductor and the second inductor.

4. The electromagnetic interference eliminating apparatus as claimed in claim 3, wherein the Y-shaped capacitor circuit comprises:

a first capacitor having two terminals, wherein a first of the two terminals of the first capacitor is connected with the second of the two terminals of the first resistor;

a second capacitor having two terminals, wherein a first of the two terminals of the second capacitor is connected with a second of the two terminals of the first capacitor and a second of the two terminals of the second capacitor is connected with the first of the two terminals of the second resistor; and a third capacitor having two terminals, wherein a first of the two terminals of the third capacitor is connected with a connection point which is between the first capacitor and the second capacitor and a second of the two terminals of the third capacitor is connected with a second of the two terminals of the third inductor.

5. An electromagnetic interference eliminating apparatus, having an input terminal and an output terminal, comprising:

a first resistor having two terminals, wherein a first of the two terminals of the first resistor is connected with the input terminal;

a serial connection inductor combination circuit having two terminals, wherein a first of the two terminals of the serial connection inductor combination circuit is connected with a second of the two terminals of the first resistor;

a serial connection capacitor combination circuit having two terminals, wherein two terminals of the serial connection capacitor combination circuit are connected with two terminals of the serial connection inductor combination circuit in parallel;

a serial connection capacitor and inductor combination circuit having two terminals and connected between the serial connection inductor combination circuit and the serial connection capacitor combination circuit;

a second resistor having two terminals, wherein a first of the two terminals of the second resistor is connected with a second of the two terminals of the serial connection inductor combination circuit;

a low pass capacitor having two terminals, wherein a first of the two terminals of the low pass capacitor is connected with the second of the two terminals of the serial connection inductor combination circuit and a second of the two terminals of the low pass capacitor is connected with a grounding terminal; and a unit gain buffer having two input terminals, wherein the first input terminal of the unit gain buffer is connected with a second of the two terminals of the second resistor and the second input terminal of the unit gain buffer is connected with the output terminal.

6. The electromagnetic interference eliminating apparatus as claimed in claim 5, wherein the serial connection inductor combination circuit comprises:

a first inductor having two terminals, wherein a first of the two terminals of the first inductor is connected with the second of the two terminals of the first resistor; and a second inductor having two terminals, wherein a first of the two terminals of the second inductor is connected with a second of the two terminals of the first inductor and a second of the two terminals of the second inductor is connected with the first of the two terminals of the second resistor.

7. The electromagnetic interference eliminating apparatus as claimed in claim 6, wherein the serial connection capacitor combination circuit comprises:

a first capacitor having two terminals, wherein a first of the two terminals of the first capacitor is connected with the second of the two terminals of the first resistor; and a second capacitor having two terminals, wherein a first of the two terminals of the second capacitor is connected with a second of the two terminals of the first capacitor and a second of the two terminals of the second capacitor is connected with the first of the two terminals of the second resistor.

8. The electromagnetic interference eliminating apparatus as claimed in claim 7, wherein the serial connection capacitor and inductor combination circuit comprises:

a third inductor having two terminals, wherein a first of the two terminals of the third inductor is connected with a connection point which is between the first capacitor and the second capacitor; and a third capacitor having two terminals, wherein a first of the two terminals of the third capacitor is connected with a connection point which is between the first inductor and the second inductor, and a second of the two terminals of the third capacitor is connected with a second of the two terminals of the third inductor.

9. The electromagnetic interference eliminating apparatus as claimed in claim 7, wherein the serial connection capacitor and inductor combination circuit comprises:

a third inductor having two terminals, wherein a first of the two terminals of the third inductor is connected with a connection point which is between the first inductor and the second inductor; and a third capacitor having two terminals, wherein a first of the two terminals of the third capacitor is connected with a connection point which is between the first capacitor and the second capacitor, and a second of the two terminals of the third capacitor is connected with a second of the two terminals of the third inductor.

* * * * *